United States Patent
Park et al.

(10) Patent No.: US 8,710,657 B2
(45) Date of Patent: Apr. 29, 2014

(54) SEMICONDUCTOR ASSEMBLY AND SEMICONDUCTOR PACKAGE INCLUDING A SOLDER CHANNEL

(75) Inventors: Jeong-woo Park, Suwon-si (KR); Moon-gi Cho, Suwon-si (KR); Ui-hyoung Lee, Seoul (KR); Sun-hee Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 125 days.

(21) Appl. No.: 13/242,864

(22) Filed: Sep. 23, 2011

(65) Prior Publication Data

US 2012/0086123 A1 Apr. 12, 2012

(30) Foreign Application Priority Data

Oct. 6, 2010 (KR) .................... 10-2010-0097418

(51) Int. Cl.
*H01L 21/44* (2006.01)

(52) U.S. Cl.
USPC ............ 257/738; 257/778; 257/E23.021; 257/E23.069; 257/E21.503; 257/E21.021

(58) Field of Classification Search
USPC .......... 257/738, 737, 739, E23.021, E23.069, 257/E21.503, E21.508
See application file for complete search history.

(56) References Cited

U.S. PATENT DOCUMENTS

| | | | | |
|---|---|---|---|---|
| 5,261,593 A * | 11/1993 | Casson et al. | ............ | 228/180.22 |
| 5,493,096 A * | 2/1996 | Koh | ............ | 219/121.71 |
| 5,542,601 A * | 8/1996 | Fallon et al. | ............ | 228/119 |
| 5,633,204 A * | 5/1997 | Tago et al. | ............ | 438/614 |
| 5,828,128 A * | 10/1998 | Higashiguchi et al. | ....... | 257/738 |
| 5,834,844 A * | 11/1998 | Akagawa et al. | ............ | 257/734 |
| 5,872,399 A * | 2/1999 | Lee | ............ | 257/738 |
| 5,883,435 A * | 3/1999 | Geffken et al. | ............ | 257/758 |
| 5,936,848 A * | 8/1999 | Mehr et al. | ............ | 361/777 |
| 6,025,650 A * | 2/2000 | Tsuji et al. | ............ | 257/786 |
| 6,078,104 A * | 6/2000 | Sakurai | ............ | 257/738 |
| 6,084,781 A * | 7/2000 | Klein | ............ | 361/771 |
| 6,091,141 A * | 7/2000 | Heo | ............ | 257/704 |
| 6,103,552 A * | 8/2000 | Lin | ............ | 438/113 |
| 6,127,204 A * | 10/2000 | Isaacs et al. | ............ | 438/106 |
| 6,891,273 B2 * | 5/2005 | Pu et al. | ............ | 257/780 |
| 7,115,998 B2 * | 10/2006 | Hiatt et al. | ............ | 257/773 |
| 7,122,897 B2 * | 10/2006 | Aiba et al. | ............ | 257/738 |
| 7,271,484 B2 * | 9/2007 | Reiss et al. | ............ | 257/738 |
| 7,713,858 B2 * | 5/2010 | Raravikar et al. | ............ | 438/612 |

(Continued)

FOREIGN PATENT DOCUMENTS

| | | |
|---|---|---|
| JP | 2000-243785 | 9/2000 |
| JP | 2001-093935 | 4/2001 |
| KR | 1020060074706 A | 7/2006 |

*Primary Examiner* — Michael Shingleton
(74) *Attorney, Agent, or Firm* — Myers Bigel Sibley & Sajovec, P.A.

(57) ABSTRACT

Semiconductor packages connecting a semiconductor chip to an external device by bumps are provided. The semiconductor packages may include a connection pad on a semiconductor chip, a connecting bump on and configured to be electrically connected to the connection pad and a supporting bump on the semiconductor chip and configured to be electrically isolated from the connection pad. The connection bump may include a first pillar and a first solder ball and the supporting bump may include a second pillar and a second solder ball. The semiconductor packages may further include a solder channel in the second pillar configured to allow a portion of the second solder ball to extend into the solder channel along a predetermined direction.

18 Claims, 9 Drawing Sheets

(56) References Cited

U.S. PATENT DOCUMENTS

| | | | |
|---|---|---|---|
| 7,786,596 B2* | 8/2010 | Chen et al. | 257/777 |
| 7,977,788 B2* | 7/2011 | Chang et al. | 257/737 |
| 8,227,924 B2* | 7/2012 | Shen et al. | 257/775 |
| 8,344,483 B2* | 1/2013 | Raravikar et al. | 257/621 |
| 8,395,052 B2* | 3/2013 | Ishimatsu et al. | 174/257 |
| 2001/0028111 A1* | 10/2001 | Suzuki et al. | 257/738 |
| 2001/0040290 A1* | 11/2001 | Sakurai et al. | 257/737 |
| 2006/0051954 A1* | 3/2006 | Lin et al. | 438/614 |
| 2006/0055032 A1* | 3/2006 | Chang et al. | 257/734 |
| 2006/0060968 A1* | 3/2006 | Wark et al. | 257/737 |
| 2008/0150135 A1* | 6/2008 | Oyama et al. | 257/738 |
| 2008/0296765 A1* | 12/2008 | Kurita | 257/738 |
| 2008/0315385 A1* | 12/2008 | Gerber et al. | 257/686 |
| 2009/0079070 A1* | 3/2009 | Lin et al. | 257/738 |
| 2009/0261851 A1* | 10/2009 | Zhou et al. | 324/757 |
| 2010/0219511 A1* | 9/2010 | Raravikar et al. | 257/621 |
| 2010/0314745 A1* | 12/2010 | Masumoto et al. | 257/692 |
| 2011/0012261 A1* | 1/2011 | Choi et al. | 257/738 |
| 2011/0169158 A1* | 7/2011 | Varanasi | 257/692 |
| 2011/0193220 A1* | 8/2011 | Kuo et al. | 257/737 |
| 2011/0198747 A1* | 8/2011 | Kuo et al. | 257/737 |
| 2011/0248398 A1* | 10/2011 | Parvarandeh et al. | 257/737 |
| 2012/0012985 A1* | 1/2012 | Shen et al. | 257/618 |
| 2012/0061834 A1* | 3/2012 | Kang | 257/738 |
| 2012/0086123 A1* | 4/2012 | Park et al. | 257/738 |
| 2013/0020698 A1* | 1/2013 | Hsieh et al. | 257/737 |
| 2013/0049198 A1* | 2/2013 | Liao et al. | 257/738 |

* cited by examiner

SEMICONDUCTOR ASSEMBLY AND SEMICONDUCTOR PACKAGE INCLUDING A SOLDER CHANNEL

CROSS-REFERENCE TO RELATED APPLICATION

This U.S. non-provisional patent application claims the benefit of Korean Patent Application No. 10-2010-0097418, filed on Oct. 6, 2010, in the Korean Intellectual Property Office, the disclosure of which is hereby incorporated by reference in its entirety.

BACKGROUND

The present disclosure generally relates to the field of electronics, and more particular to a semiconductor package.

Due to current developments in the electronic industries, electronic components can have a high performance and a high efficiency and can be miniaturized. In this regard, semiconductor packages may be highly integrated and thin and have finely patterned circuits. In the surface mount technology of electronic components, flip-chip bonding has been used to electrically connect a semiconductor chip to a printed circuit board.

SUMMARY

According to some embodiments, semiconductor packages may include a plurality of connection pads on a surface of a semiconductor chip. The semiconductor packages may also include a plurality of first bumps on and configured to be electrically connected to the plurality of connection pads. Each of the plurality of first bumps may include a first solder ball and a first pillar between the first solder ball and one of the plurality of connection pads. The semiconductor packages may further include a plurality of second bumps on the semiconductor chip and configured to be electrically isolated from the plurality of connection pads. Each of the plurality of second bumps may include a second solder ball and a second pillar between the second solder ball and the semiconductor chip, and the second pillar may additionally include a solder channel configured to allow a portion of the second solder ball to extend into the solder channel.

In some embodiments, the solder channel may be on a side of the second pillar and may include a grove depressed toward a center of the second pillar.

In some embodiments, the solder channel may extend upwards and downwards along the side of the second pillar.

In some embodiments, the second solder ball may extend at least partially into the solder channel.

In some embodiments, the plurality of second bumps may be arranged in a first direction at a first pitch and may be arranged in a second direction at a second pitch that may be greater than the first pitch. The first direction may be substantially perpendicular to the second direction and the solder channel may face toward the second direction.

In some embodiments, the plurality of first bumps and the plurality of second bumps may comprise an array.

In some embodiments, the plurality of first bumps may be at a center portion of the semiconductor chip and the plurality of second bumps may be at a peripheral portion of the semiconductor chip.

In some embodiments, the solder channel may be on a side of the second pillar and may face toward the peripheral portion of the semiconductor chip.

In some embodiments, heights of each of the plurality of first bumps relative to the surface of the semiconductor chip may substantially equal to heights of each of the plurality of second bumps relative to the surface of the semiconductor chip.

In some embodiments, the semiconductor packages may further include a passivation layer between the plurality of second bumps and the semiconductor chip.

In some embodiments, the semiconductor packages may further include a plurality of conductive patterns between the plurality of first bumps and the semiconductor chip and the plurality of second bumps and the semiconductor chip.

In some embodiments, the semiconductor packages may be flip-chip packages.

According to some embodiments, semiconductor packages may include a plurality of first connection pads on a surface of a printed circuit board and a plurality of second connection pads on a surface of a semiconductor chip. The semiconductor packages may also include a plurality of first bumps on and configured to be electrically connected to the plurality of second connection pads. Each of the plurality of first bumps may include a first solder ball and a first pillar between the first solder ball and one of the plurality of second connection pads, and the plurality of first bumps may be configured to electrically connected to the plurality of first connection pads. The semiconductor packages may further include a plurality of second bumps on the semiconductor chip and configured to be electrically isolated from the plurality of second connection pads. Each of the plurality of second bumps may include a second solder ball and a second pillar between the second solder ball and the semiconductor chip, and the second pillar may additionally include a solder channel configured to allow a portion of the second solder ball to extend into the solder channel.

In some embodiments, heights of each of the plurality of first bumps relative to the surface of the semiconductor chip may be substantially equal to heights of each of the plurality of second bumps relative to the surface of the semiconductor chip.

According to some embodiments, semiconductor assemblies may include a semiconductor chip and a pillar, on the semiconductor chip, configured to receive a solder ball. The semiconductor assemblies may also include a solder channel in the pillar configured to allow a portion of the solder ball to extend into the solder channel along a predetermined direction.

In some embodiments, the pillar may include a first pillar configured to receive a first solder ball. The semiconductor assemblies may further include a connection pad on the semiconductor chip and a second pillar on and configured to be electrically connected to the connection pad. The second pillar may be configured to receive a second solder ball and the first pillar may be configured to be electrically isolated from the connection pad.

In some embodiments, the first pillar may be immediately adjacent to the second pillar and the solder channel may face away from the second pillar.

In some embodiments, the semiconductor assemblies may further include a passivation layer between the first pillar and the semiconductor chip.

In some embodiments, the solder channel may be on a side of the pillar and may include a grove depressed toward a center of the pillar.

In some embodiments, the solder channel may extend upwards and downwards along the side of the pillar.

According to some embodiments, semiconductor assemblies may include a connection pad on a surface of a semiconductor chip. The semiconductor assemblies may also include a first bump on and configured to be electrically connected to the connection pad. The first bump may include a first solder ball and a first pillar between the first solder ball and the connection pad. The semiconductor assemblies may further include a second bump on the semiconductor chip and configured to be electrically isolated from the connection pad. The second bump may comprise a second solder ball and a second pillar between the second solder ball and the semiconductor chip. A height of the first pillar relative to the surface of the semiconductor chip may be lower than a height of the second pillar relative to the surface of the semiconductor chip but respective heights of the first bump and the second bump relative to the surface of the semiconductor chip may be substantially equal. A portion of the second solder ball may extend on a side of the second pillar along a predetermined direction.

BRIEF DESCRIPTION OF THE DRAWINGS

Example embodiments will be more clearly understood from the following detailed description taken in conjunction with the accompanying drawings in which.

DETAILED DESCRIPTION

Figure 1:
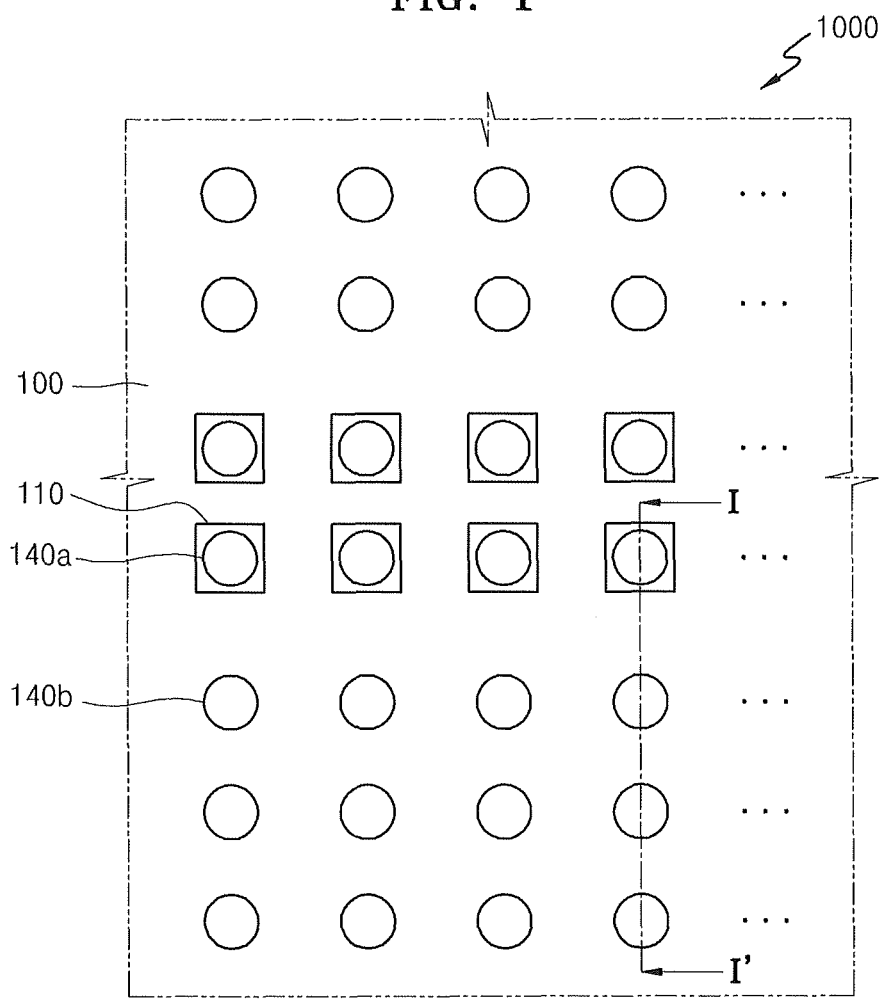
FIG. 1 is a plan view schematically illustrating a semiconductor package according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "connected" to or "on" another element, it can be directly connected to or on the other element or intervening elements may also be present. In contrast, when an element is referred to as being "directly connected" to or "directly on" another element, there are no intervening elements present.

It will be understood that when an element is referred to as being "adjacent to" another element, it can be immediately adjacent to the other element or intervening elements may also be present. In contrast, when an element is referred to as being "immediately adjacent to" another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A semiconductor package is manufactured by forming a passivation layer and a redistribution layer on a semiconductor chip, in which an electrode is formed, such as a wafer level package (WLP), a chip scale package (CSP), and the like. Also, bumps are formed in the redistribution layer for electrical connection with an external device such as a printed circuit board.

FIG. 1 is a plan view schematically illustrating a semiconductor package 1000 according to some embodiments.

Referring to FIG. 1, a semiconductor chip 100 may be provided, wherein the semiconductor chip 100 includes connection pads 110, connecting bumps 140a, and supporting bumps 140b. The semiconductor chip 100 may include a semiconductor device including an active region. The connecting bumps 140a may be formed on the connection pads 110 and used to electrically connect the semiconductor chip 100 to an external device such as a printed circuit board. When the semiconductor chip 100 is electrically connected to the external device, the supporting bumps may be fanned around the connecting bumps 140a. The supporting bumps 140b may be formed for physical support of the semiconductor chip 100 and may be electrically isolated from the connection pads 110.

The semiconductor chip 100 may include a semiconductor device. The semiconductor device may be a memory device, such as a dynamic random access memory (DRAM) device, a static random access memory (SRAM) device, a phase-change random access memory (PRAM) device, or a flash memory device, or a non-memory device such as a logic device. More specifically, the semiconductor device may include a transistor, a resistor, and wiring. Also, elements for protecting a semiconductor package or a semiconductor device, for example, a passivation layer, may be formed on the semiconductor device.

The connection pads 110 may include a conductive material. The connection pads 110 may be redistribution layers. The connection pads 110 may be electrically connected to a conductive area of the semiconductor device included in the semiconductor chip 100. The connection pads 110 may be formed by deposition processes, such as Chemical Vapor Deposition (CVD), Physical Vapor Deposition (PVD) or Atomic Layer Deposition (ALD), and etching processes.

The connecting bumps 140a may be formed on the semiconductor chip 100. Specifically, the connecting bumps 140a may be formed at a center portion of the semiconductor chip 100. The connecting bumps 140a may be formed on the connection pads 110 and may include a conductive material having high electrical conductivity and thermal conductivity. The connecting bumps 140a may increase a height of connecting electrodes, such as connection pads 110, that are used to connect the semiconductor chip 100 to an external device, and may facilitate electrical connection. The connecting bumps 140a may have ohmic contacts with the connection pads 110.

The supporting bumps 140b may be formed on a peripheral portion of the semiconductor chip 100 or an area where the connecting bumps 140a are not formed. When the semiconductor chip 100 is mounted to an external device, the supporting bumps 140b may enhance physical stability of mounting. The supporting bumps 140b may be formed of the same material and at the same time as the connecting bumps 140a through the same processes.

The connecting bumps 140a and the supporting bumps 140b may comprise a plurality of columns. For example, the connecting bumps 140a may be arranged in two columns at the center portion of the semiconductor chip 100 and the supporting bumps 140b may be arranged in a plurality of columns at the peripheral portion of the semiconductor chip 100. The connecting bumps 140a and the supporting bumps 140b may also comprise an array including rows and columns.

Figure 2:
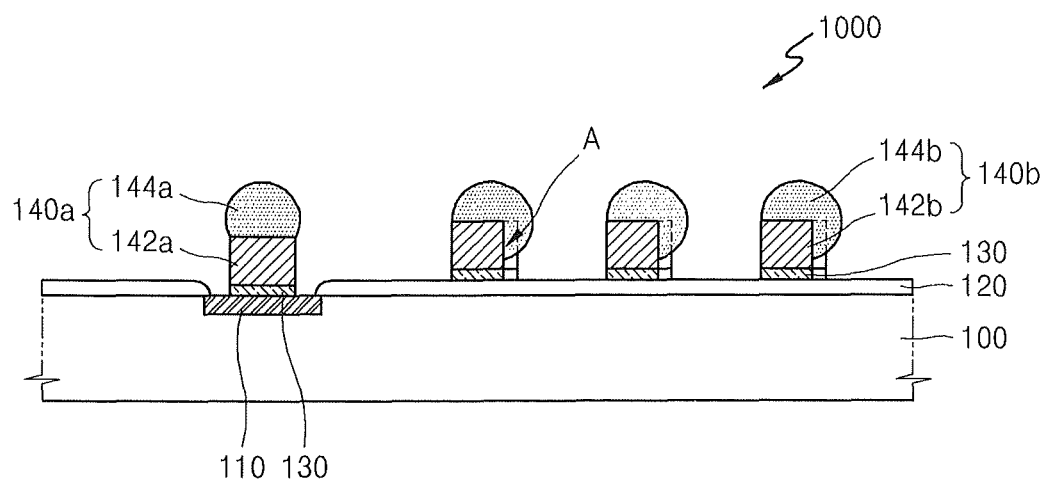
FIG. 2 is a cross-sectional view of a semiconductor package according to some embodiments.

FIG. 2 is a cross-sectional view of the semiconductor package 1000 according to some embodiments. FIG. 2 is a cross-sectional view of the semiconductor package 1000 cut along a line I-I' of FIG. 1.

Referring to FIG. 2, the semiconductor package 1000 may be provided, wherein the semiconductor package 1000 includes the semiconductor chip 100 on which the connection pads 110 and a passivation layer 120 are formed. The passivation layer 120 may be formed on the semiconductor chip 100 except in an area where the connection pads 110 are formed. The passivation layer 120 may define openings which expose the connection pads 110. The connecting bumps 140a may be fondled on the connection pads 110.

Each of the connecting bump 140a may include a first pillar 142a and a first solder ball 144a. Each of the supporting bumps 140b may be formed on the passivation layer 120. Each of the supporting bumps 140b may include a second pillar 142b and a second solder ball 144b. A seed layer 130 may be formed on the lower surfaces of the connecting bumps 140a and the supporting bumps 140b.

The first pillar 142a of the connecting bump 140a may have various shapes including a cylindrical or a polygonal pillar. The first solder ball 144a of the connecting bump 140a may be formed on the first pillar 142a and may have various shapes including a hemisphere.

A solder channel A may be formed on a side of the second pillar 142b of the supporting bumps 140b. The solder channel A may include a groove depressed toward a center of the second pillar 142b. Accordingly, a portion of the second pillar 142b of the supporting bumps 140b may have a smaller width than the first pillar 142a of the connecting bumps 140a. The second solder ball 144b of the supporting bumps 140b may have various shapes including a hemisphere. A portion of the second solder ball 144b may extend into the solder channel A since a portion of the second solder ball 144b may collapse into the solder channel A on a side of the second pillar 142b. The connecting bumps 140a and the supporting bumps 140b will be described more in detail with FIGS. 3A and 3B.

The length of the first pillar 142a of the connecting bumps 140a may be substantially equal to the length of the second pillar 142b of the supporting bumps 140b. Here the length of a pillar is the distance between the first surface of the pillar facing the semiconductor chip 100 and the second surface opposite to the first surface. Also, heights of the connecting bumps 140a may be substantially equal to the heights of the supporting bumps 140b. That means that the upper surface of the first solder ball 144a may be substantially coplanar with the upper surface of the second solder ball 144b. Here the height of the bump is the height relative to the surface of the semiconductor chip 100.

A semiconductor device having a predetermined height may be formed on the semiconductor chip 100. The semiconductor device may be formed on a semiconductor substrate. The semiconductor substrate may include a semiconductor material, for example, a group IV semiconductor material, a group III-V semiconductor material, or a group II-VI oxide semiconductor material. For example, the group IV semiconductor material may include silicon (Si), germanium (Ge), or silicon-germanium (SiGe). The semiconductor substrate may include a bulk wafer or an epitaxial layer. Also, the semiconductor substrate may include a silicon-on-insulator (SOI).

Each of the connection pads 110 may include a conductive material. The connection pad 110 may include at least one selected from the group consisting of aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellium (Te), titanium (Ti), tungsten (W), zinc (Zn), zirconium (Zr), and silicides thereof.

The connecting bumps 140a and the supporting bumps 140b may include a conductive material. For example, the first pillar 142a, the second pillar 142b, the first solder ball 144a and the second solder ball 144b may include one metal or a metal alloy selected from the group consisting of aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

In the semiconductor package 1000 according to some embodiments, the upper surface of the first solder ball 144a may be substantially coplanar with the upper surface of the second solder ball 144b even though the connecting bumps 140a and the supporting bumps 140b are formed on the step in the passivation layer 120. Accordingly, when the semiconductor chip 100 is connected to an external device, such as a printed circuit board, bonding may be easily performed and a defect related to a mounting process may be prevented. The solder channel A may be formed on a side of the second pillar 142b of the supporting bumps 140b and thus the second solder ball 144b may collapse on the side of the second pillar 142b. That means the second pillar 142b may collapse along a predetermined direction where the solder channel A is formed. Accordingly, electrical shorts between the connecting bumps 140a and the supporting bumps 140b may be prevented and fine-pitch bumps may be formed.

As described above, a passivation layer may be formed between the supporting bump 140b and the semiconductor chip 100. Therefore, when the length of the first pillar 142a of the connecting bumps 140a is substantially equal to the length of the second pillar 142b of the supporting bump 140b, a height of the first pillar 142a of the connecting bumps 140a is lower than a height of the second pillar 142b of the supporting bump 140b. However, respective heights of the connecting bumps 140a and the supporting bumps 140b relative to the surface of the semiconductor chip may be substantially equal because a portion of the second solder ball 144b collapses on a side of the second pillar 142b. The length of a pillar is the distance between the first surface of the pillar facing the semiconductor chip 100 and the second surface opposite to the first surface. The height of a pillar is the height relative to the surface of the semiconductor. Therefore the solder channel A may equalize the heights of the connecting bumps 140a and the supporting bumps 140b relative to the surface of the semiconductor by allowing the second solder ball 144b to extend into the solder channel A.

FIGS. 3A through 3D are perspective views of the connecting bump 140a and the supporting bump 140b of a semiconductor package according to some embodiments.

Figure 3A:
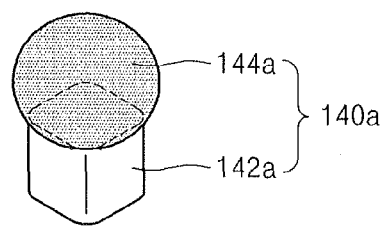
FIGS. 3A through 3D are perspective views of bumps of a semiconductor package according to some embodiments.

Referring to FIG. 3A, the connecting bump 140a is provided. The connecting bump 140a may include the first pillar 142a and the first solder ball 144a.

As illustrated in FIG. 3A, the first pillar 142a may be a square pillar but the first pillar 142a may have various shapes including a cylinder or a polygonal pillar. The first solder ball 144a may be formed on the first pillar 142a.

The first solder ball 144a may have various shapes including a hemisphere. The first pillar 142a and the first solder ball 144a may have substantially equal thicknesses or different thicknesses. The first pillar 142a may be thicker than the first solder ball 144a, and vice versa.

Figure 3B:
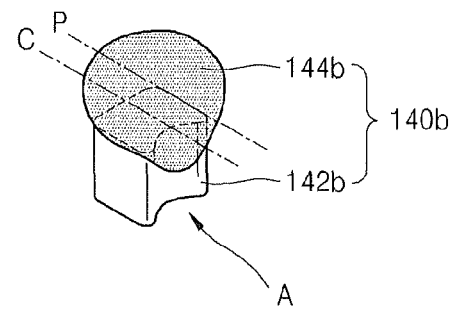

Referring to FIG. 3B, the supporting bump 140b is provided. The supporting bump 140b may include the second pillar 142b and the second solder ball 144b.

The second pillar 142b may be a square pillar and the solder channel A may be formed on a side of the second pillar 142b. The solder channel A may include a depressed portion depressed toward a center of the second pillar 142b. Accordingly, the center portion C of the second pillar 142b may have the smaller width than the peripheral portion P of the second pillar 142b. In some embodiments, the second pillar 142b may be a cylinder or a polygonal pillar and the solder channel A may be formed on a side of the second pillar 142b. The solder channel A may be extended to the upper surface and/or lower surface of the second pillar 142b. Also, the solder channel A may be short so that the solder channel A starts from the upper surface of the second pillar 142b but does not reach the lower surface of the second pillar 142b.

The second solder ball 144b may have various shapes including a hemisphere and may be formed on the second pillar 142b. The second solder ball 144b may extend on a side of the second pillar 142b along the solder channel A. That is, the second solder ball 144b may extend into the solder channel A. The solder channel A may include a grove depressed toward a center of the second pillar 142b.

Referring to FIGS. 3A and 3B, vertical thicknesses of the first pillar 142a of the connecting bump 140a and the second pillar 142b of the supporting bump 140b may be substantially equal. A vertical thickness of the second solder ball 144b of the supporting bump 140b may be smaller than a vertical thickness of the first solder ball 144a of the connecting bump 140a by a predetermined height, for example, about 5 μm to 10 μm.

Figure 3C:
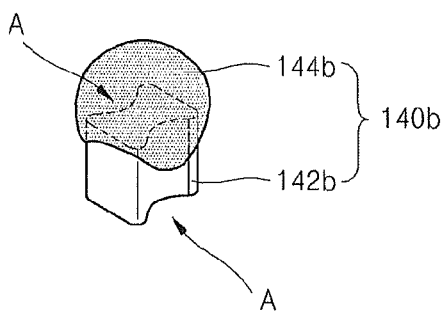
Figure 3D:
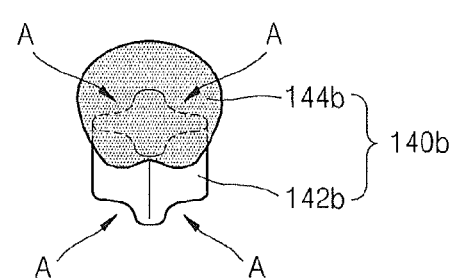

Referring to FIGS. 3C and 3D, the supporting bumps 140b according to some embodiments are provided. Each of the supporting bumps 140b may include the second pillar 142b and the second solder ball 144b.

In the supporting bumps 140b of FIG. 3C, the solder channels A are formed on two opposing sides of the second pillar 142b. The second solder ball 144b may extend to two directions along the two solder channels A.

In the supporting bump 140b of FIG. 3D, the solder channels A may be formed on four sides of the second pillar 142b. The second solder ball 144b may extend to four directions along the four solder channels A. That means the solder channels A may allow the second solder ball 144b extend to predetermined directions that the solder channels A are formed.

FIGS. 4 through 11 are cross-sectional views illustrating a method of manufacturing the semiconductor package 1000 according to some embodiments.

Figure 4:
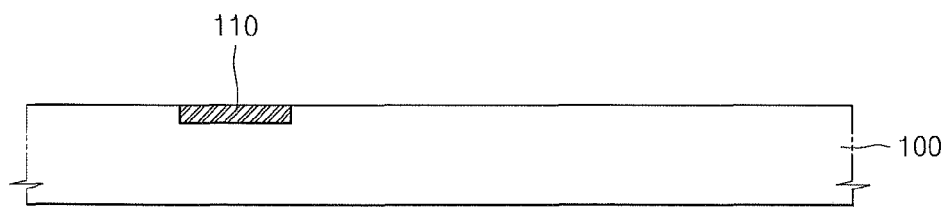
FIGS. 4 through 11 are cross-sectional views illustrating a method of manufacturing the semiconductor package of FIG. 2 according to some embodiments.

Referring to FIG. 4, the semiconductor chip 100, in which the connection pad 110 is formed, may be provided. The surface of the semiconductor chip 100, in which the connection pad 110 is formed, may be an active surface of a semiconductor device in the semiconductor chip 100. The connection pad 110 may be formed to electrically connect the semiconductor chip 100 to an external device. The connection pad 110 may be a part of a redistribution layer. The connection pad 110 may be electrically connected to a conductive area of the semiconductor chip 100.

The connection pad 110 may include a metal, for example, aluminum (Al). The connection pad 110 may be formed by deposition processes such as a sputtering process or a thermal evaporation process and patterning processes. The connection pad 110 may be electrically connected to a conductive area of a semiconductor device in the semiconductor chip 100 and an insulation layer may be formed around the connection pads 110 in the semiconductor chip 100.

Figure 5:
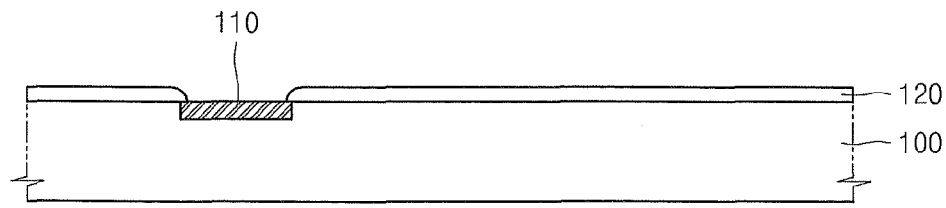

Referring to FIG. 5, the passivation layer 120 may be formed on the semiconductor chip 100. The passivation layer 120 may protect the active surface of the semiconductor chip 100. Also, the passivation layer 120 may absorb a stress from the outside.

The passivation layer 120 may not be formed on the connection pad 110 so that the opening defined by the passivation layer may expose the connection pad 110. The passivation layer 120 may include an insulation resin, for example, a polyimide-based material, such as photo sensitive polyimide (PSPI). When the passivation layer 120 includes PSPI, the passivation layer 120 may be formed by a deposition process such as a spin coating, and a patterning process such as an exposure and a development process without forming a photoresist layer.

Figure 6:
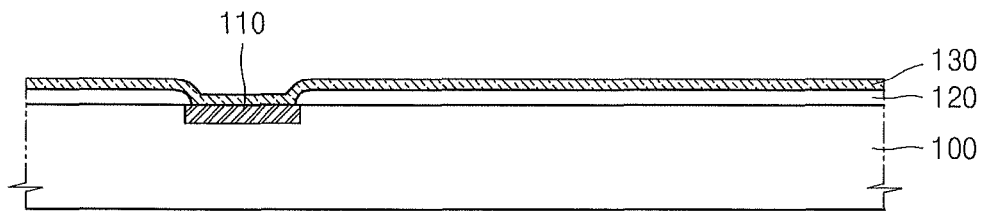

Referring to FIG. 6, the seed layer 130 may be formed on the passivation layer 120 and the connection pad 110. The seed layer 130 may be a multilayer including a double layer. The upper portion of the seed layer 130 may function as a seed so that a plated metal may be easily grown when electroplating is used later. The lower portion of the seed layer 130 disposed on the connection pad 110 may block diffusion of the upper seed layer 130 to the connection pad 110.

The seed layer 130 may include a conductive material selected from the group consisting of titanium (Ti), copper (Cu), and titanium tungsten (TiW). Also, as described above, the seed layer 130 may be a double layer including Ti/Cu or TiW/Cu. The seed layer 130 may be formed by using CVD, PVD, or ALD.

Figure 7:
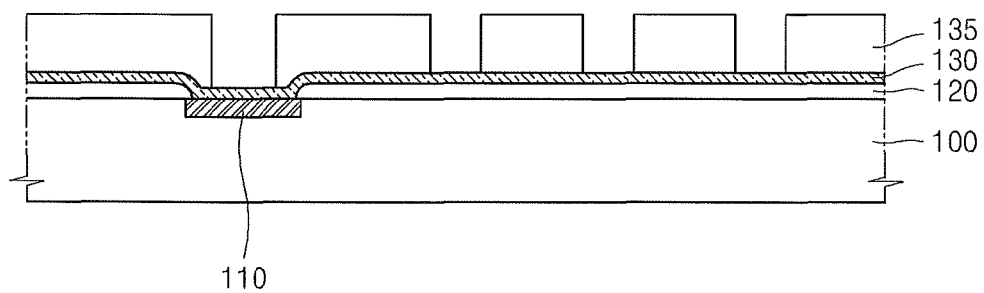

Referring to FIG. 7 and FIG. 2, mask patterns 135 may be formed on the seed layer 130. The mask patterns 135 may expose areas where the connecting bumps 140*a* and the supporting bumps 140*b* are to be formed in the semiconductor package 1000 of FIG. 2 by defining several openings. The mask patterns 135 may be photoresist patterns. In this case, the mask patterns 135 may be formed by forming a photoresist layer on the seed layer 130 and by patterning the photoresist layer by exposure and development processes.

Each of the openings, defined by the mask patterns 135, formed in areas where the connecting bumps 140*a* are to be formed, may be a circle or a polygonal shape. Additionally, each of the openings, defined by the mask patterns 135, formed in areas where the supporting bumps 140*b* are to be formed may be a circle or a polygonal shape including a depressed portion on a side of each of the openings. The depressed portion of each of the openings may be formed at a predetermined position.

Sizes of the openings for the connecting bumps 140*a* and the supporting bumps 140*b* may be substantially equal. That is, when the openings are square or rectangular, respective lengths of the three sides which do not include the depressed portion may be substantially equal. When the openings are circles, respective diameters of the openings for the connecting bumps 140*a* and the supporting bumps 140*b* may be substantially equal. Heights of the mask patterns 135 may determine heights of the connecting bumps 140*a* and the supporting bumps 140*b*, and may be about 50 μm.

Figure 8:
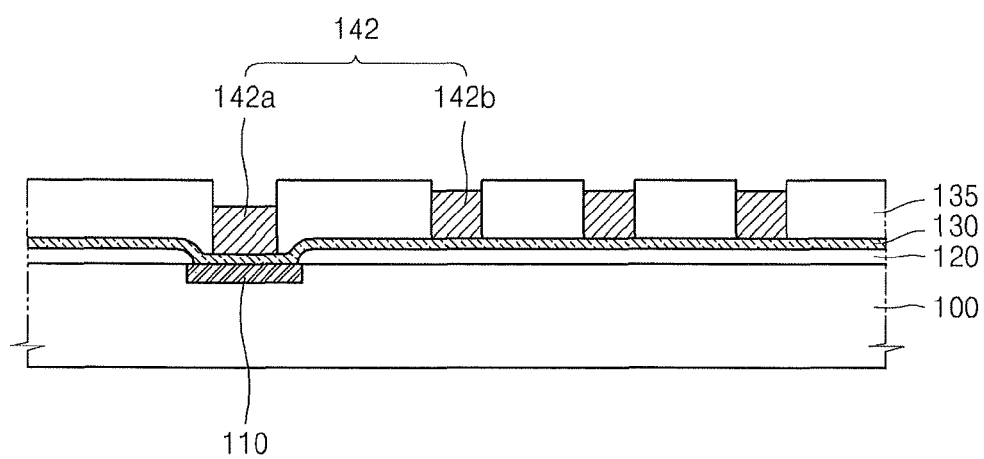

Referring to FIG. 8, first conductive materials 142 are formed on the seed layer 130 exposed by the mask patterns 135. The first conductive materials 142 may constitute the first pillar 142*a* of the connecting bump 140*a* of FIG. 2 and the second pillar 142*b* of the supporting bumps 140*b* of FIG. 2.

The first pillar 142*a* and the second pillar 142*b* enable the formation of the connecting bumps 140*a* and the supporting bumps 140*b* at a fine pitch and also enable signal transmission between the semiconductor chip 100 and an external device. Also, the first pillar 142*a* and the second pillar 142*b* may provide a distance between the semiconductor chip 100 and an external device and enhance heat radiation.

When the passivation layer 120 is not formed in an area where the first pillar 142*a* of the connecting bumps 140*a* is formed, the first conductive materials 142 constituting the second pillar 142*b* of the supporting bumps 140*b* may have a higher upper surface than the first conductive materials 142 constituting the first pillar 142*a* of the connecting bumps 140*a* due to the step formed by the passivation layer 120. That means when the first pillar 142*a* and the second pillar 142*b* are formed on different surfaces having different upper surfaces relative to the surface of the semiconductor chip 100, respective heights of first pillar 142*a* and the second pillar 142*b* may be different since the first pillar 142*a* and the second pillar 142*b* are formed through the same processes.

The upper surface of the first conductive materials 142 may be lower than the upper surface of the mask patterns 135. The first conductive materials 142 may be formed by electroplating, CVD, PVD or ALD. The first conductive materials 142 may include, for example, copper (Cu). When the CVD or PVD is used to form the conductive materials 142, the seed layer 130 may not be used.

Figure 9:
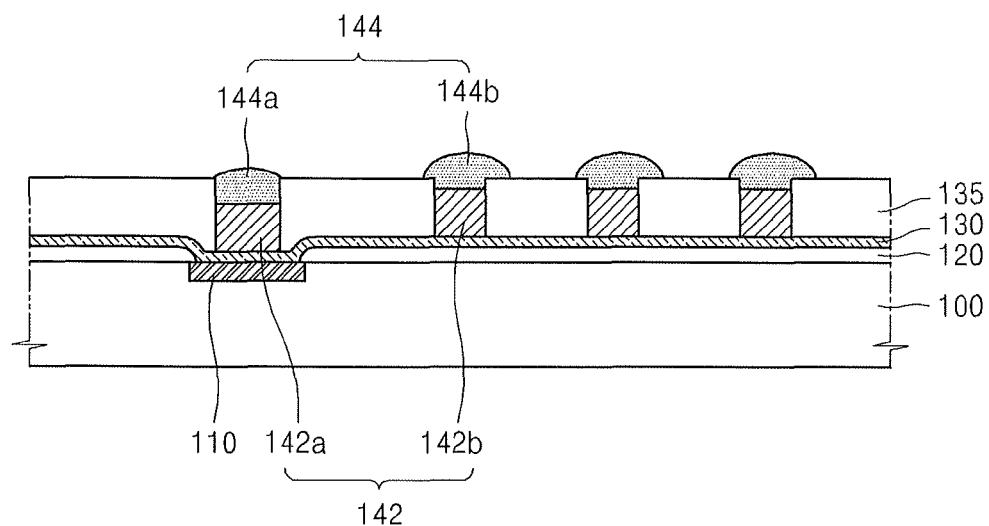

Referring to FIG. 9, the second conductive materials 144 may be formed on the first conductive materials 142. The second conductive materials 144 may be used for forming the first solder ball 144*a* of the connecting bump 140*a* and the second solder ball 144*b* of the supporting bumps 140*b*. Since the second conductive materials 144 may be used to form the first solder ball 144*a* and the second solder ball 144*b*, the second conductive materials 144 may prevent diffusion, corrosion, and oxidization of the first conductive materials 142.

The upper surfaces of the second conductive materials 144 constituting the second solder ball 144*b* of the supporting bump 140*b* may be higher than those of the second conductive materials 144 constituting the first solder ball 144*a* of the connecting bumps 140*a* since the heights of the upper surfaces of the first conductive materials 142 may vary. In this regard, the second conductive materials 144 constituting the second solder ball 144*b* of the supporting bump 140*b* may be formed on the mask patterns 135 and may extend to the upper surface of the mask patterns 135.

The second conductive materials 144 may be formed by electroplating, electroless plating, CVD, PVD, or ALD. The second conductive materials 144 may include one metal or a metal alloy selected from the group consisting of copper (Cu), nickel (Ni), silver (Ag), gold (Au), lead (Pb), platinum (Pt), and tin (Sn). For example, the second conductive materials 144 may include one selected from the group consisting of tin-silver (Sn—Ag), copper-nickel-lead (Cu—Ni—Pb), copper-nickel-gold (Cu—Ni—Au), copper-nickel (Cu—Ni), nickel-gold (Ni—Au), or nickel-silver (Ni—Ag).

Figure 10:
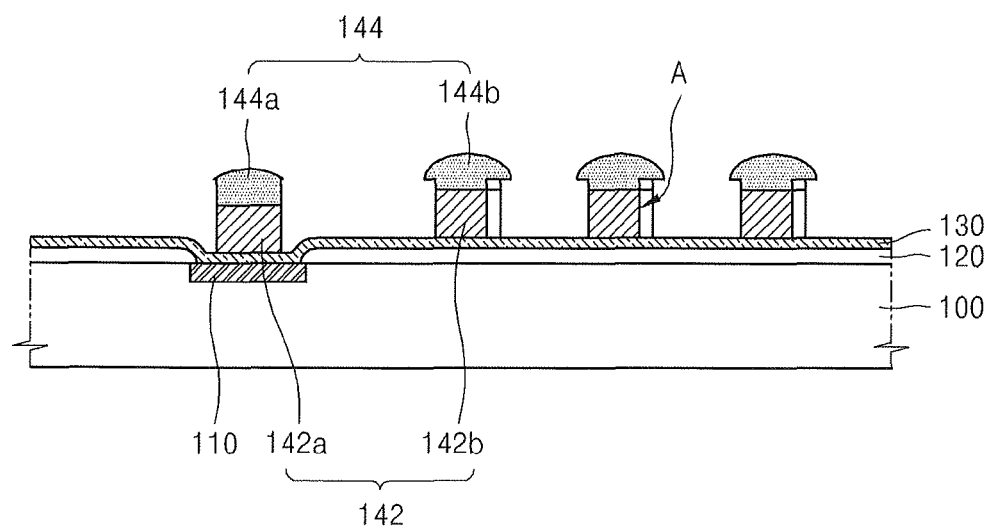

Referring to FIG. 10, the mask patterns 135 are removed. The mask patterns 135 may be removed by dry etching or wet etching processes. When the mask patterns 135 include photoresist, the mask patterns 135 may be removed by ashing and stripping processes.

After the mask patterns 135 are removed, the connecting bumps 140*a* and the supporting bumps 140*b* are formed on the seed layer 130. The connecting bumps 140*a* and the supporting bumps 140*b* may have different heights relative to the surface of the semiconductor chip 100. Also, the first ball 144*a* of the connecting bumps 140*a* and the second solder ball 144*b* of the supporting bumps 140*b* may have different shapes.

Figure 11:
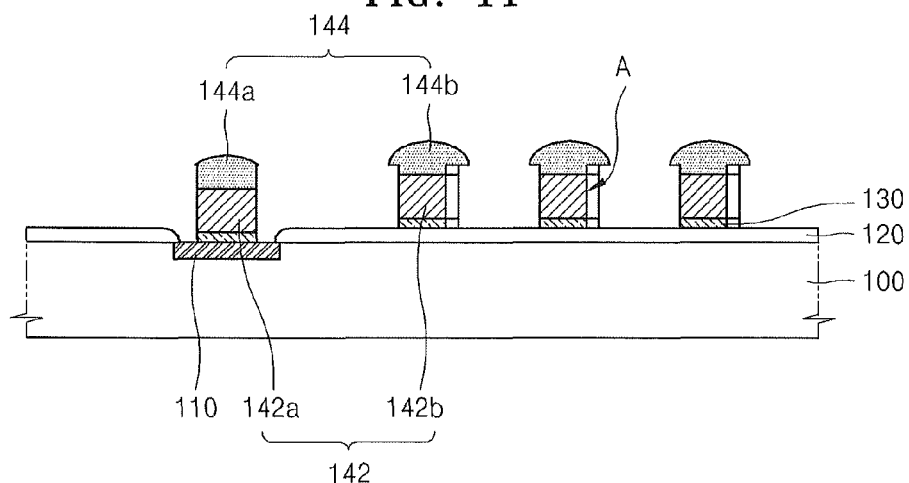

Referring to FIG. 11, the seed layer 130 not covered by the connecting bumps 140*a* and the supporting bumps 140*b* may be removed. The seed layer 130 may be removed by any appropriate processes such as a dry etching process, for example a reactive ionic etch (RIE), or a wet etching process.

A heat treatment process, such as a reflow process, may be performed. The heat treatment process may be a separate process for forming the first solder ball 144*a* and the second solder ball 144*b*. In some embodiments, the heat treatment process may be a soldering process for bonding the first solder ball 144*a* and the second solder ball 144*b* to an external device. The heat treatment process may be performed at a temperature above a melting point of the first solder ball 144*a* and the second solder ball 144*b*, for example, a temperature of about 260° C. or above. The heat treatment process may be performed at a normal pressure and under a nitrogen (N2) atmosphere. The heat treatment process may be performed for a few minutes, for example, about one minute to two minutes.

After the heat treatment process is completed, the semiconductor package 1000 of FIG. 2 may be formed. The first solder ball 144*a* and the second solder ball 144*b* are melted during the heat treatment process so as to be flowable and may be a ball due to a surface tension. Also, the second solder ball 144b of the supporting bump 140b may flow into the solder channel A formed on a side of the second pillar 142b. That is, the second solder ball 144b may be formed by collapsing of a portion of the second solder ball 144b into the solder channel A. As described above a portion of the second pillar ball 144b may be extended into a predetermined direction where the solder channel A is formed.

Figure 12A:
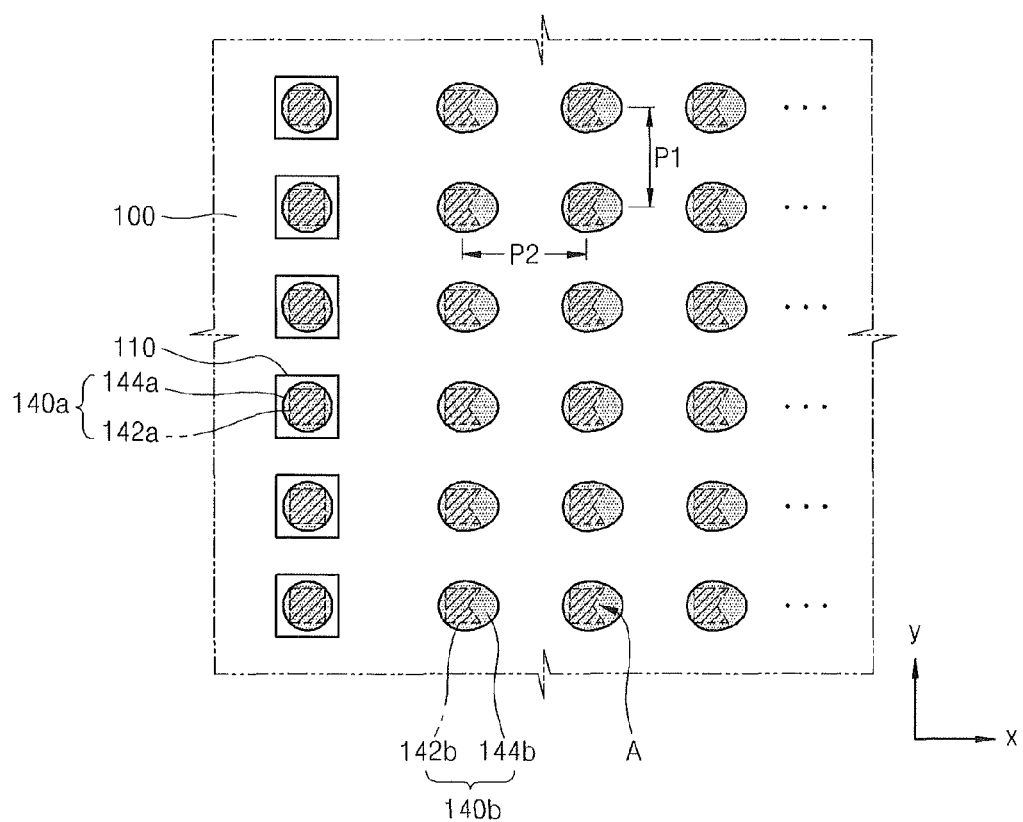
FIGS. 12A and 12B are plan views illustrating a method of manufacturing a semiconductor package according to some embodiments.
Figure 12B:
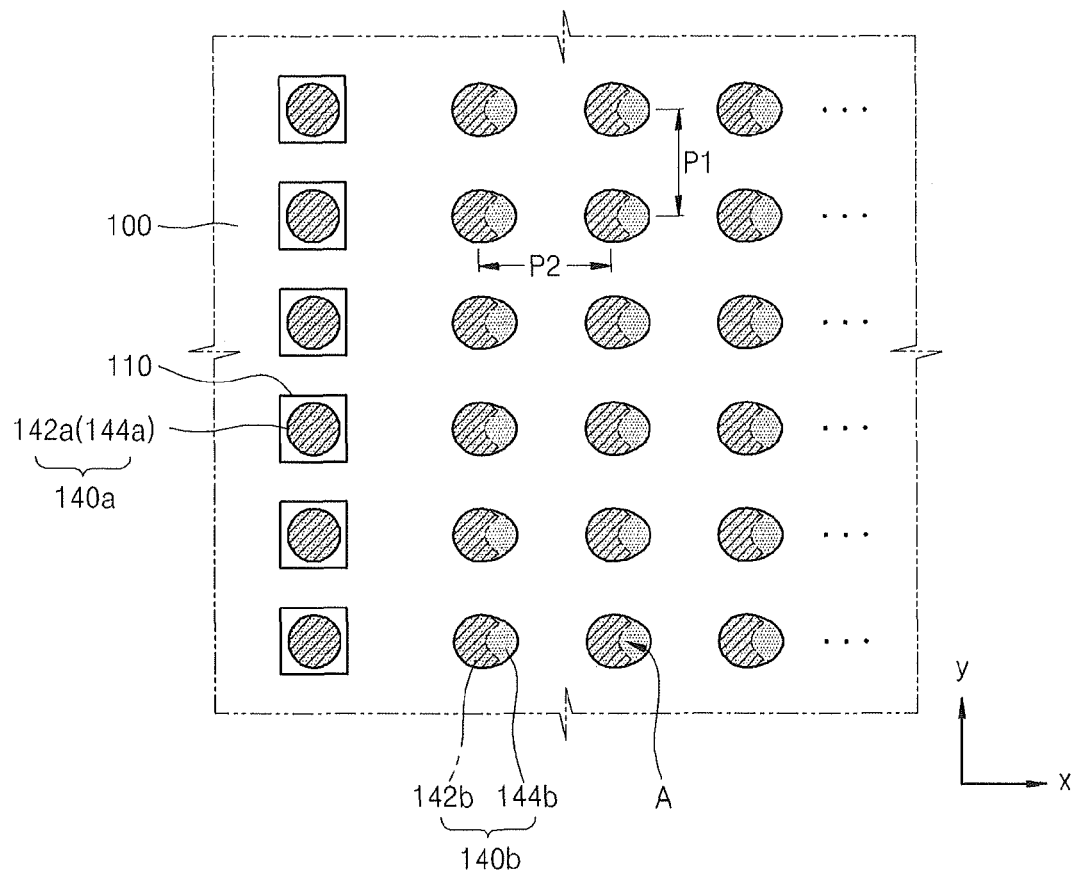

FIGS. 12A and 12B are plan views illustrating a method of manufacturing a semiconductor package according to some embodiments.

Referring to FIG. 12A, the connecting bumps 140a and the supporting bumps 140b may be arranged adjacent to each other. In this case, one of the connecting bumps 140a and one of the supporting bumps 140b may be arranged immediately adjacent to each other.

The connecting bumps 140a may be formed on the connection pads 110 of the semiconductor chip 100. Each of the connecting bumps 140a may include the first pillar 142a and the first solder ball 144a. The first pillar 142a may have various shapes including a square pillar and the first solder ball 144a may have various shapes including a sphere.

The supporting bumps 140b may be arranged at the peripheral portion of the semiconductor chip 100 where the connection pads 110 are not formed. The supporting bumps 140b may be arranged around the connecting bumps 140a. The supporting bumps 140b may be arranged in a first direction (y-direction in FIG. 12A) at a first pitch P1 and may be arranged in a second direction (x-direction in FIG. 12A) at a second pitch P2. The first direction (y-direction in FIG. 12A) may be substantially perpendicular to the second direction (x-direction in FIG. 12A) and the second pitch P2 may be greater than the first pitch P1.

Each of the supporting bumps 140b may include the second pillar 142b and the second solder ball 144b. The second pillar 142b may include the solder channel A including a depressed portion on one side of the second pillar 142b. The solder channel A may include a groove depressed toward a center of the second pillar 142b. The solder channels A may face toward the second direction (x-direction in FIG. 12A). Also, the solder channel A may be only on one side of the second pillar 142b facing toward the peripheral portion of the semiconductor chip in the second direction (x-direction in FIG. 12A) in order to prevent electrical shorts with the connecting bumps 140a. The plurality of supporting bumps 140b on the same rows in the second direction (x-direction in FIG. 12A) may include the solder channels A facing toward the same direction.

In the semiconductor package 1000 according to some embodiments, the second solder ball 144b of the supporting bumps 140b is induced to collapse in a single direction, for example, the second direction (x-direction in FIG. 12A), thereby preventing bridges between the connecting bumps 140a and the supporting bumps 140b. In some embodiments, the second solder ball 144b of the supporting bumps 140b may be induced to collapse in multiple directions.

Referring to FIG. 12B, the connecting bumps 140a and the supporting bumps 140b may be arranged adjacent to each other as in FIG. 12A. In this case, one of the connecting bumps 140a and one of the supporting bumps 140b may be arranged immediately adjacent to each other. Different from FIG. 12A, the cross section of the second pillar 142b of the supporting bumps 140b may be a circle or oval including the solder channel A. In the plurality of supporting bumps 140b, the solder channels A may be formed facing toward the second direction (x-direction in FIG. 12A) as illustrated in FIG. 12A.

In the some embodiments, the solder channels A are formed in the supporting bumps 140b. However, in some embodiments, one or more solder channels A may be formed in each of the connecting bumps 140a or a portion of the connection bumps 140a in order to prevent bridges between the connecting bumps 140a and the supporting bumps 140b. In this case, the sizes of the first pillar 142a and the second pillar 142b and the number of solder channels A formed in one of the first pillar 142a and the second pillar 142b may vary in order to make respective heights of the connecting bumps 140a and the supporting bumps 140b substantially equal. Here the heights of the bumps are defined as the height relative to the surface of the semiconductor.

As described above, the solder channel A may equalize the heights of the connecting bumps 140a and the supporting bumps 140b relative to the surface of the semiconductor by allowing the first solder ball 144a and/or second solder ball 144b to extend into the solder channel A. Therefore when there are bigger differences among heights of the connecting bumps 140a and the supporting bumps 140b, the solder channel A may be capable of allowing larger amounts of the first solder ball 144a and/or second solder ball 144b to extend into the solder channel A. Increasing a number of the solder channels A or widening width of the solder channels A may allow larger amounts of the first solder ball 144a and/or second solder ball 144b to extend into the solder channels A. Accordingly, the number of the solder channels A and width of the solder channels A may be determined based on differences among heights of the connecting bumps 140a and the supporting bumps 140b.

Figure 13:
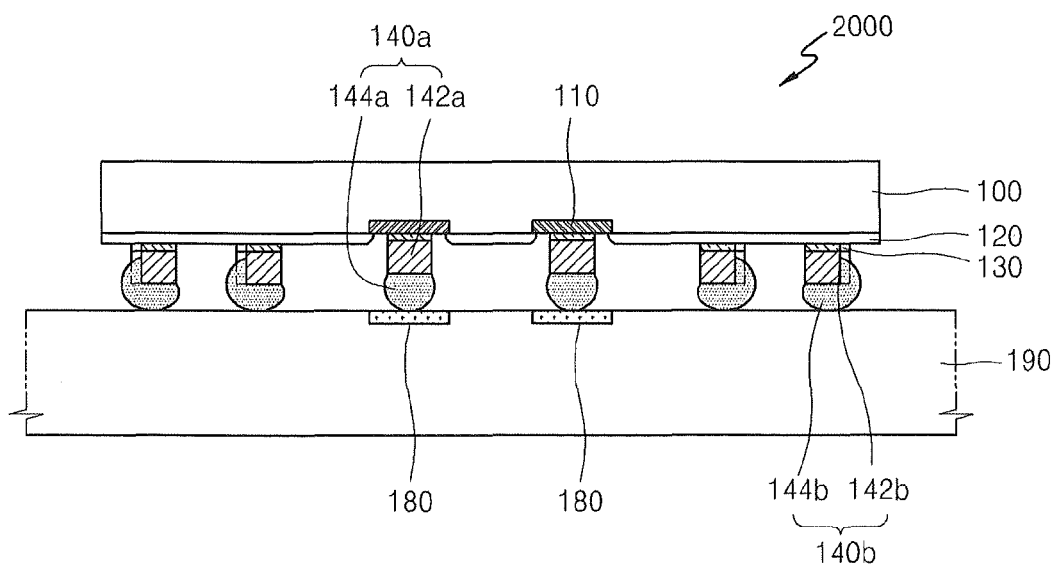
FIG. 13 is a cross-sectional view of a semiconductor package according to some embodiments.

FIG. 13 is a cross-sectional view of a semiconductor package 2000 according to some embodiments.

Referring to FIG. 13, the flip-chip package 2000 according to some embodiments is provided. The flip-chip package 2000 may be electrically connected to a printed circuit board 190 through the connecting bumps 140a formed on one side of the semiconductor chip 100. The semiconductor chip 100 may provide an electrical signal to the printed circuit board 190 through the connection pads 110, the connecting bumps 140a, and board pads 180.

The printed circuit board 190 may include epoxy resin, polyimide resin, bismaleide triazine (BT) resin, Flame Retardant 4 (FR-4), FR-5, ceramic, silicon, or glass. The printed circuit board 190 may be a single layer or a plurality of layers including wiring patterns. For example, the printed circuit board 190 may have a single rigid board, or may be formed by attaching a plurality of rigid boards or attaching a thin flexible printed circuit board to a rigid board. Each of the plurality of rigid boards that are attached to each other or the printed circuit boards may include a wiring pattern. Also, the printed circuit board 190 may be a low-temperature co-fired ceramic (LTCC) board. The LTCC board may include a plurality of ceramic layers including wiring patterns. The printed circuit board 190 may include plated through holes (PTH) and/or blind via holes (BVH) so as to electrically connect the upper surface of the printed circuit board 190 to the lower surface of the printed circuit board 190.

In addition, underfill materials of a liquid resin material may be injected to gaps between the semiconductor chip 100 and the printed circuit board 190 and gaps between the connecting bumps 140a and the supporting bumps 140b. The underfill materials are hardened, thereby forming an underfill layer.

In the flip-chip package 2000 according to some embodiments, when the semiconductor chip 100 is connected to the printed circuit board 190, mounting stability may be improved by the supporting bumps 140*b*. The heights of the connecting bumps 140*a* and the supporting bumps 140*b* relative to the surface of the semiconductor are substantially equal so that an area for supporting the semiconductor chip 100 is increased due to the supporting bumps 140*b* and thus the semiconductor chip 100 may be stably mounted.

The flip-chip package 2000 may be connected to the printed circuit board 190 so as to form a semiconductor module. In this case, the printed circuit board 190 may further include other packages and external connection terminals. Various types of package such as ball grid array (BGA) packages or chip scale packages (CSPs) may also be used.

Figure 14:
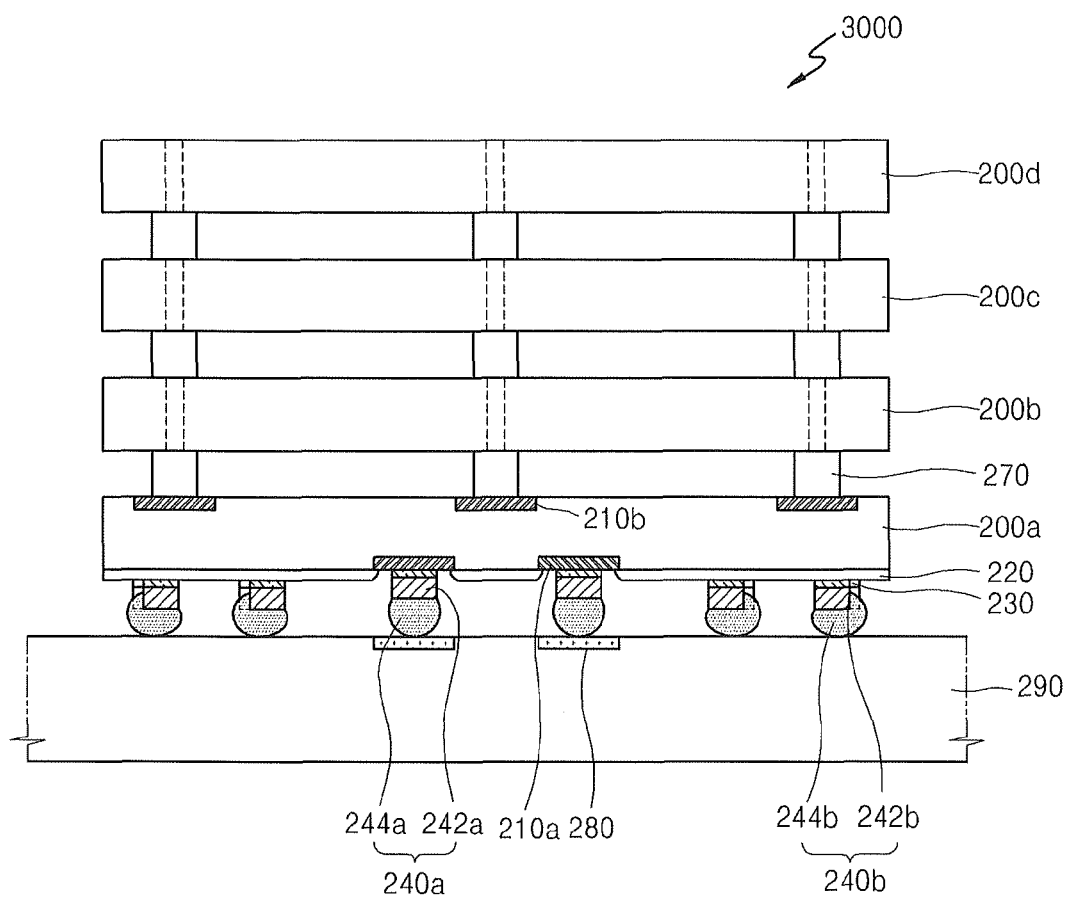
FIG. 14 is a cross-sectional view of a semiconductor package according to some embodiments.

FIG. 14 is a cross-sectional view of a semiconductor package according to some embodiments.

Referring to FIG. 14, a multi-stack package (MSP) 3000 according to some embodiments is provided. The MSP 3000 may have a structure in which a plurality of semiconductor chips 200*a*, 200*b*, 200*c*, and 200*d* are stacked on a printed circuit board 290. The plurality of semiconductor chips 200*a*, 200*b*, 200*c*, and 200*d* may be bonded to each other by connecting bumps 270. The semiconductor chip 200*a* disposed at the lowest position may provide an electrical signal to the printed circuit board 290 through connection pads 210*a*, connecting bumps 240*a*, and board pads 280.

The plurality of semiconductor chips 200*a*, 200*b*, 200*c*, and 200*d* may be electrically connected to each other by the connecting bumps 270 and the connection pads 210*b*, and through silicon vias (TSVs), illustrated as dash lines, which may be formed in each of the plurality of semiconductor chips 200*a*, 200*b*, 200*c*, and 200*d*.

In the MSP 3000, when the plurality of semiconductor chips 200*a*, 200*b*, 200*c*, and 200*d* are stacked on the printed circuit board 290 and are connected to the printed circuit board 290, mounting stability may be improved by the supporting bumps 240*b* of the semiconductor chip 200*a*. Heights of the upper surfaces of the connecting bumps 240*a* and the supporting bumps 240*b* are substantially equal so areas for supporting a stack structure of the plurality of semiconductor chips 200*a*, 200*b*, 200*c*, and 200*d* may be increased, and thus the plurality of semiconductor chips 200*a*, 200*b*, 200*c*, and 200*d* may be stably mounted. Also, bridges between the connecting bumps 240*a* and the supporting bumps 240*b* may be prevented so as to form the fine-pitched connecting bumps 240*a* and supporting bumps 240*b* and thus the MSP 3000 may be miniaturized.

Figure 15:
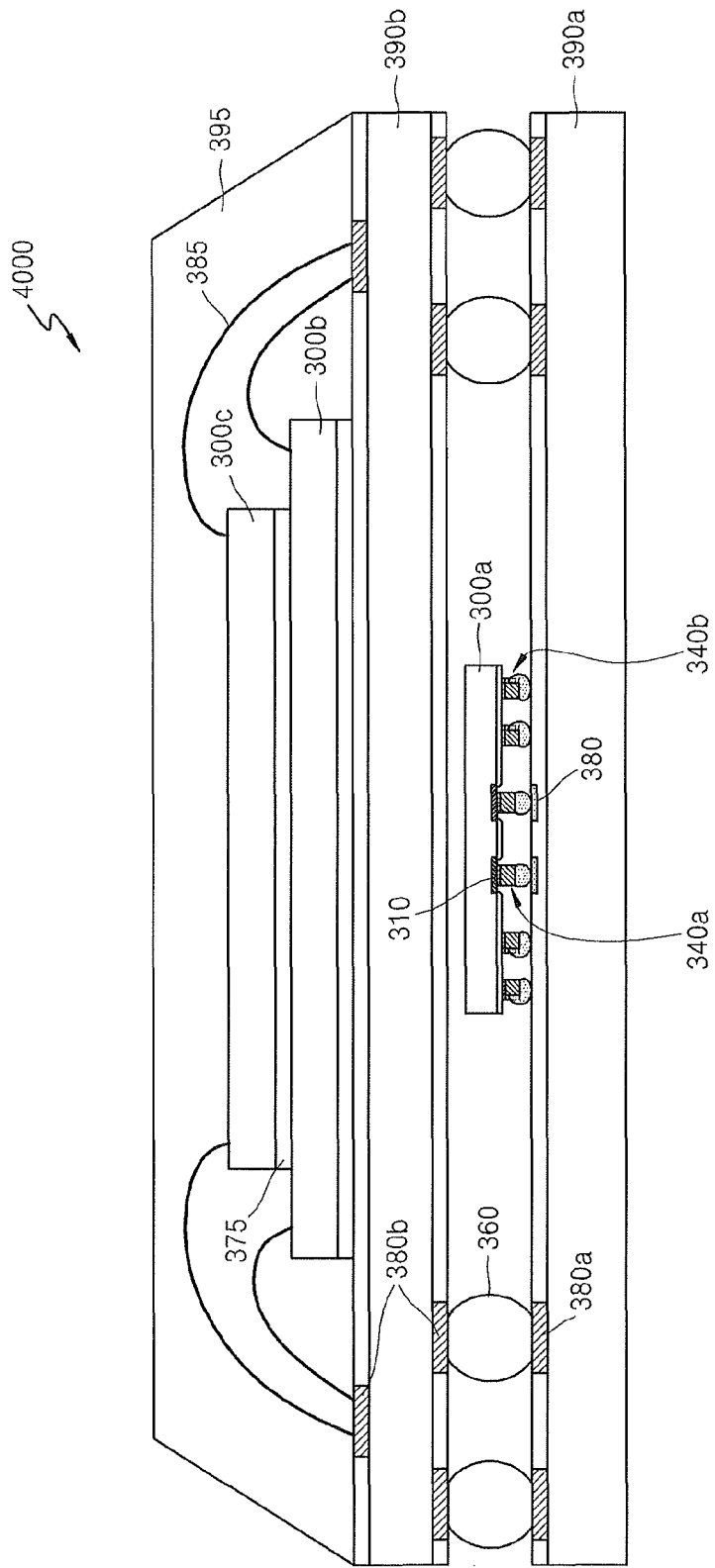
FIG. 15 is a cross-sectional view of a semiconductor package according to some embodiments.

FIG. 15 is a cross-sectional view of a semiconductor package according to some embodiments.

Referring to FIG. 15, a package on package (POP) 4000 according to some embodiments is provided. The POP is a high-density package realized according to the demands for highly functional and miniaturized electronic components and has a structure in which package boards are stacked.

The POP 4000 has a structure in which an upper semiconductor package is stacked on a lower semiconductor package. The upper semiconductor package may be electrically connected to the lower semiconductor package by conductive bumps 360 and board pads 380*a* and 380*b* interposed therebetween.

The lower semiconductor package may have a structure in which a semiconductor chip 300*a* is stacked on a first board 390*a*. The lower semiconductor package may have a similar structure to the semiconductor package 1000 of FIG. 2.

The upper semiconductor package may have a structure in which semiconductor chips 300*b* and 300*c* are stacked on a second board 390*b*. The second board 390*b* may be bonded to the semiconductor chip 300*b*, and the semiconductor chip 300*b* may be bonded to the third semiconductor chip 300*c* by adhesive layers 375 interposed therebetween. Semiconductor devices in each of the semiconductor chips 300*b* and 300*c* may be electrically connected to the second board 390*b* by conductive wires 385 and the board pads 380*b*. Also, the semiconductor chips 300*b* and 300*c* may be electrically connected to the second board 390*b* through vias in the semiconductor chips 300*b* and 300*c*. A molding unit 395, such as an epoxy molding compound (EMC), for example, may be formed to protect the semiconductor chips 300*b* and 300*c*.

In the POP 4000 according to some embodiments, when the semiconductor chip 300*a* is connected to the first board 390*a*, mounting stability may be improved by supporting bumps 340*b*. The heights of the connecting bumps 340*a* and the supporting bumps 340*b* are substantially equal so that an area for supporting the semiconductor chip 300*a* is increased and thus the semiconductor chip 300*a* may be stably mounted.

Also, bridges between the connecting bumps 340*a* and the supporting bumps 340*b* may be prevented so as to form the fine-pitched connecting bumps 340*a* and supporting bumps 340*b*. In addition, a height of the lower semiconductor package may be lowered by using a flip-chip method. Accordingly, the POP 4000 may be miniaturized.

Figure 16:
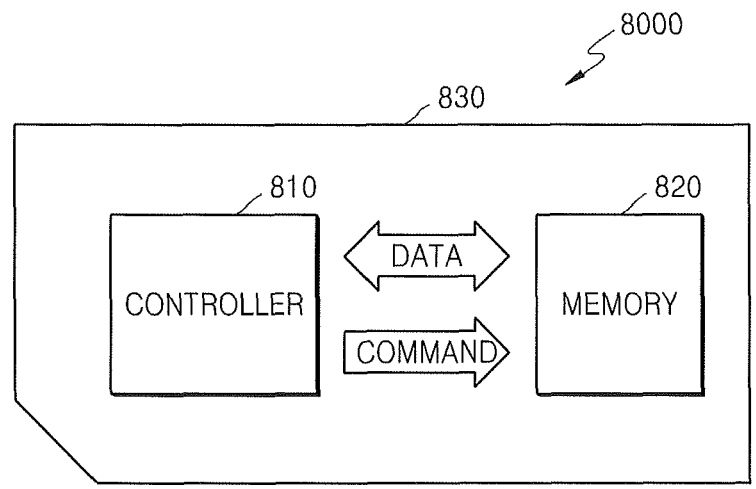
FIG. 16 is a schematic diagram of a memory card including a semiconductor package according to some embodiments.

FIG. 16 is a schematic diagram of a memory card 8000 including a semiconductor package according to some embodiments.

Referring to FIG. 16, the memory card 8000 may include a controller 810 and a memory 820 included in a housing 830. The controller 810 may provide an electrical signal to the memory 820. For example, data may be communicated between the controller 810 and the memory 820 according to a command of the controller 810. In this regard, the memory card 8000 may store data in the memory 820 or output data from the memory 820 to the outside.

The memory card 8000 may be used as a data storage medium of various portable devices. For example, the memory card 8000 may include a multi media card (MMC) or a secure digital (SD) card.

Figure 17:
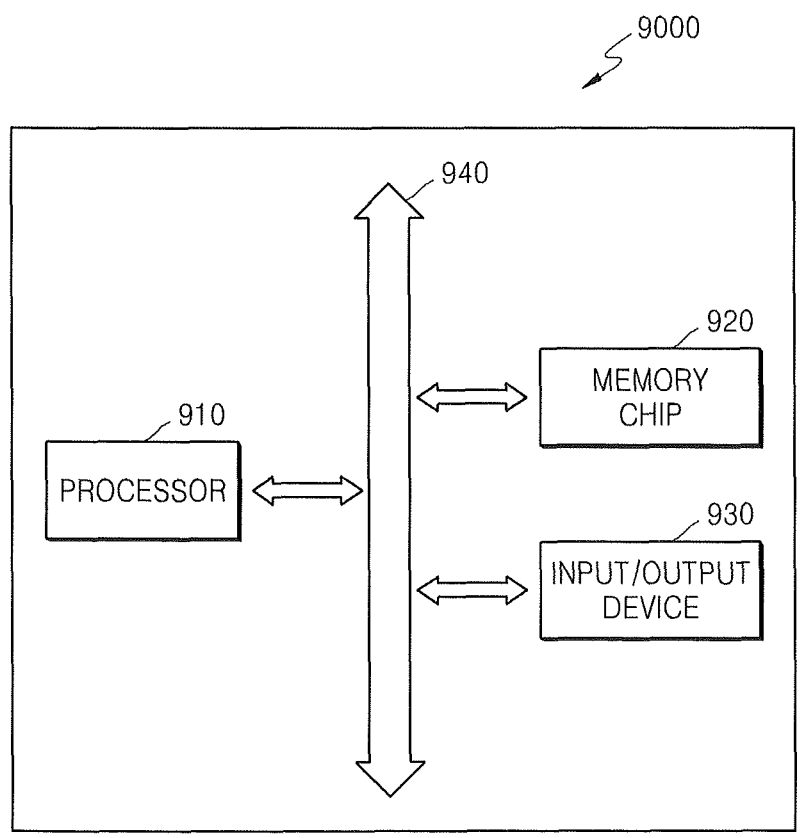
FIG. 17 is a schematic diagram of an electronic system including a semiconductor package according to some embodiments.

FIG. 17 is a schematic diagram of an electronic system 9000 including a semiconductor package according to some embodiments.

Referring to FIG. 17, the electronic system 9000 may include a processor 910, an input/output device 930, and a memory chip 920, and data may be communicated therebetween via a bus 940. The processor 910 may execute a program and control the electronic system 9000. The input/output device 930 may be used to input or output data of the electronic system 9000. The electronic system 9000 is connected to an external device, for example, a personal computer or a network, by using the input/output device 930 and may communicate data with the external device. The memory chip 920 may store code and data for operating the processor 910.

The electronic system 9000 may constitute various electronic control devices that require the memory chips 920 and may be used in, for example, mobile phones, MP3 players, navigations, solid state disks (SSD), household appliances, and the like. While the inventive concept has been particularly shown and described with reference to example embodiments thereof, it will be understood that various changes in form and details may be made therein without departing from the spirit and scope of the following claims.

What is claimed is:

1. A semiconductor package comprising:
   a plurality of connection pads on a surface of a semiconductor chip;
   a plurality of first bumps on and configured to be electrically connected to the plurality of connection pads, wherein each of the plurality of first bumps comprises a first solder ball and a first pillar between the first solder ball and one of the plurality of connection pads;
   a plurality of second bumps on the semiconductor chip and configured to be electrically isolated from the plurality of connection pads, wherein each of the plurality of second bumps comprises a second solder ball and a second pillar between the second solder ball and the semiconductor chip, and the second pillar comprises a solder channel configured to allow a portion of the second solder ball to extend into the solder channel; and
   a passivation layer extending between the plurality of second bumps and the semiconductor chip,
   wherein bottom surfaces of the plurality of second bumps contact the passivation layer, and the bottom surfaces of the plurality of second bumps are higher than bottom surfaces of the plurality of first bumps relative to the surface of the semiconductor chip.

2. The semiconductor package of claim 1, wherein the solder channel is on a side of the second pillar and comprises a groove depressed toward a center of the second pillar.

3. The semiconductor package of claim 2, wherein the solder channel extends upwards and downwards along the side of the second pillar.

4. The semiconductor package of claim 1, wherein the second solder ball extends at least partially into the solder channel.

5. The semiconductor package of claim 1, wherein the plurality of second bumps are arranged in a first direction at a first pitch and are arranged in a second direction at a second pitch that is greater than the first pitch, wherein the first direction is substantially perpendicular to the second direction and the solder channel faces toward the second direction.

6. The semiconductor package of claim 1, wherein the plurality of first bumps are at a center portion of the semiconductor chip and the plurality of second bumps are at a peripheral portion of the semiconductor chip, and wherein the solder channel is on a side of the second pillar and faces toward the peripheral portion of the semiconductor chip.

7. The semiconductor package of claim 1 further comprising a plurality of conductive patterns between the plurality of first bumps and the semiconductor chip and the plurality of second bumps and the semiconductor chip.

8. The semiconductor package of claim 1, wherein the semiconductor package is a flip-chip package.

9. A semiconductor assembly comprising:
   a semiconductor chip comprising a connection pad on a surface thereof;
   a first pillar, on the semiconductor chip, comprising a solder channel on a side thereof;
   a first solder ball on the first pillar, wherein the first pillar is between the first solder ball and the semiconductor chip, and a portion of the first solder ball extends into the solder channel and covers at least a portion of the side of the first pillar;
   a passivation layer, on the semiconductor chip, extending between the first pillar and the semiconductor chip and comprising an opening exposing the connection pad;
   a second pillar, on the semiconductor chip, contacting the connection pad and comprising a non-solder-channel pillar; and
   a second solder ball on the second pillar, wherein the second pillar is between the second solder ball and the semiconductor chip,
   wherein the first pillar is immediately adjacent to the second pillar and the solder channel faces away from the second pillar.

10. The semiconductor assembly of claim 9, wherein the solder channel comprises a groove depressed toward a center of the first pillar.

11. The semiconductor assembly of claim 10, wherein the solder channel extends upwards and downwards along the side of the first pillar.

12. The semiconductor assembly of claim 9, wherein a bottom surface of the first pillar contacts the passivation layer and a bottom surface of the second pillar contacts the connection pad, and wherein the bottom surface of the first pillar is higher than the bottom surface of the second pillar relative to the surface of the semiconductor chip.

13. The semiconductor assembly of claim 12, wherein vertical lengths of the first and second pillars are equivalent and a top surface of the first pillar is higher than a top surface of the second pillar relative to the surface of the semiconductor chip.

14. A semiconductor package comprising:
   a plurality of connection pads on a surface of a semiconductor chip;
   a plurality of first bumps on and configured to be electrically connected to the plurality of connection pads, wherein each of the plurality of first bumps comprises a first solder ball and a first pillar between the first solder ball and one of the plurality of connection pads;
   a plurality of second bumps on the semiconductor chip and configured to be electrically isolated from the plurality of connection pads, wherein each of the plurality of second bumps comprises a second solder ball and a second pillar between the second solder ball and the semiconductor chip, and the second pillar comprises a solder channel configured to allow a portion of the second solder ball to extend into the solder channel; and
   a passivation layer on the surface of the semiconductor chip, wherein the passivation layer comprises a plurality of openings exposing respective ones of the plurality of connection pads and extends between the plurality of second bumps and the semiconductor chip, and wherein the plurality of first bumps contact respective ones of the plurality of connection pads.

15. The semiconductor package of claim 14, wherein the first pillar comprises a non-solder-channel pillar.

16. The semiconductor package of claim 15, wherein bottom surfaces of the plurality of second bumps contact the passivation layer, and the bottom surfaces of the plurality of second bumps are higher than bottom surfaces of the plurality of first bumps relative to the surface of the semiconductor chip.

17. The semiconductor package of claim 15, wherein vertical lengths of the first and second pillars are equivalent and top surfaces of the pluralities of first and second bumps are at an equal level relative to the surface of the semiconductor chip.

18. The semiconductor package of claim 1, wherein a vertical thickness of the first solder ball is thicker than a vertical thickness of the second solder ball, and top surfaces of the plurality of first and second bumps are at an equal level relative to the surface of the semiconductor chip.

* * * * *